(12) United States Patent
Ryu et al.

(10) Patent No.: US 8,149,560 B2
(45) Date of Patent: Apr. 3, 2012

(54) ELECTROSTATIC DISCHARGE APPARATUS FOR TOUCH KEY

(75) Inventors: Seung-Woo Ryu, Gumi-si (KR); Heung-Sik Yun, Gumi-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 514 days.

(21) Appl. No.: 12/286,613

(22) Filed: Oct. 1, 2008

(65) Prior Publication Data

US 2009/0103230 A1 Apr. 23, 2009

(30) Foreign Application Priority Data

Oct. 17, 2007 (KR) ........................ 10-2007-0104558

(51) Int. Cl.
*H05F 3/02* (2006.01)
*H02H 9/00* (2006.01)
(52) U.S. Cl. .......................................... 361/220; 361/56
(58) Field of Classification Search .................... 361/56, 361/220
See application file for complete search history.

(56) References Cited

U.S. PATENT DOCUMENTS

| | | | | |
|---|---|---|---|---|
| 3,594,490 A * | 7/1971 | Mitchell et al. | ............. | 174/25 R |
| 4,303,960 A * | 12/1981 | Sherwood et al. | ........... | 361/212 |
| 4,456,800 A * | 6/1984 | Holland | ........................ | 200/5 A |
| 5,877,709 A * | 3/1999 | Ala-Lehtimaki et al. | ........ | 341/26 |
| 6,281,887 B1 | 8/2001 | Wang | | |
| 6,879,004 B2 * | 4/2005 | Leung et al. | .................. | 257/363 |
| 7,067,914 B2 * | 6/2006 | Malinowski et al. | ......... | 257/723 |
| 7,227,734 B2 * | 6/2007 | Chu | .............................. | 361/212 |
| 7,567,419 B2 * | 7/2009 | Lu et al. | ........................ | 361/220 |
| 2005/0261019 A1 | 11/2005 | Lee et al. | | |
| 2007/0040246 A1 | 2/2007 | Chen et al. | | |
| 2009/0251340 A1 | 10/2009 | Arihara | | |

FOREIGN PATENT DOCUMENTS

| | | |
|---|---|---|
| CN | 1717145 A | 1/2006 |
| EP | 1 074 905 A2 | 2/2001 |
| EP | 1 592 208 A2 | 11/2005 |
| WO | WO 2007/043576 A1 | 4/2007 |

OTHER PUBLICATIONS

European Search Report dated Nov. 9, 2011 in connection with European Patent Application No. EP 08 16 6694.

* cited by examiner

*Primary Examiner* — Jared Fureman
*Assistant Examiner* — Scott Bauer

(57) ABSTRACT

An electrostatic discharge apparatus for a touch key. A need for a conductive material or a ground layer included in the touch key is removed and a ground pattern portion is formed to prevent damage caused by static electricity introduced into the touch key. The electrostatic discharge apparatus for a touch key having a touch sensing unit and a connector unit extending from one end of the touch sensing unit includes a ground pattern portion having at least one ground pattern, which is included in the touch key and formed on a static-electricity path of the touch key, and a conduction-processing portion connecting the ground patterns with each other and connected with a main body, thereby removing a need for a ground layer provided along an internal circumference of a conventional touch sensing unit, reducing cost by not including EMI paint on the entire surface of the touch key, and preventing static electricity from being introduced into internal circuits of the touch key by causing static electricity introduced into the ground pattern portion to be discharged without passing through the internal circuits of the touch key, thus improving the stability and durability of the touch key.

18 Claims, 8 Drawing Sheets

ELECTROSTATIC DISCHARGE APPARATUS FOR TOUCH KEY

CROSS-REFERENCE TO RELATED APPLICATION(S) AND CLAIM OF PRIORITY

This application claims the benefit under 35 U.S.C.§119(a) of a Korean Patent Application filed in the Korean Intellectual Property Office on Oct. 17, 2007 and assigned Serial No. 2007-104558, the entire disclosure of which is hereby incorporated by reference.

TECHNICAL FIELD OF THE INVENTION

The present invention relates to an electrostatic discharge apparatus for a touch key, and in particular, to an electrostatic discharge apparatus for a touch key, in which a need for a conductive material or a ground layer for the touch key is removed and a ground pattern portion is formed to prevent any damage caused by static electricity introduced into the touch key.

BACKGROUND OF THE INVENTION

Typically, portable electronic apparatuses, such as portable terminals, MP3 players, Portable Multimedia Players (PMPs), and the like, allow users to enjoy various contents while carrying them. Such portable electronic apparatuses are becoming multifunctional and miniaturized according to consumers' demands. The portable electronic apparatus includes an input device for allowing a user to select and input a desired function and to see the selected function on a liquid crystal screen. The input device includes input components of various types such as a key-button type, a touch-key type, or a Navigation (hereinafter, "Navi" for short)-key type.

Generally, a key input scheme such as a Navi key or a touch key is used as a key indicating menu or additional-function selection, and a button key or a touch key is used as a key indicating a number or a character.

In particular, for a portable terminal, 3×4 numeric keys and functional keys indicating various functions such as "send", "cancel", "menu", or "search" use touch keys in general.

FIG. 1 is an exploded perspective view of layers forming a conventional touch key 10, and FIGS. 2 and 3 are a perspective view and a plane view showing a combined state of the layers forming the conventional touch key 10, respectively.

As shown in FIGS. 1 to 3, the touch key 10 is formed outside a menu key or a Navi key formed in the center. The touch key 10 is formed by combining a plurality of layers such as a touch layer 12, including a first layer 12a and a second layer 12b where circuits are formed, and an upper layer 11 and a lower layer 13 formed on and under the first layer 12a and the second layer 12b, respectively.

The touch key 10 including the layers 11, 12, and 13 may be divided into a touch sensing unit 20 for sensing a touch, and a connector unit 30 extending from one end of the touch sensing unit 20 for electrically connecting to a printed circuit board (not shown) of a main body. A ground layer 15 is provided along an inner circumference of the touch sensing unit 20 to ground static electricity introduced into the touch key 10.

An electromagnetic interference (EMI) paint 14 is coated onto the entire surface of the touch sensing unit 20. The EMI paint 14 includes a conductive material to let a current flow. Static electricity introduced into the touch key 10 is absorbed by the ground layer 15 and then is discharged through the EMI paint 14 and the connector unit 30.

The lower layer 13 includes light emitting diodes (LEDs, not shown) for illuminating the touch key 10 in positions corresponding to the position of the touch sensing unit 20.

However, since both the touch sensing unit 20 and the LEDs are formed at a side of the ground layer 15, static electricity introduced into the touch key 10 may bounce to the LEDs and the touch sensing unit 20. Due to the bounce of static electricity absorbed by the ground layer 15, static electricity introduced into the touch sensing unit 20 or the LEDs may damage circuits formed in the touch key 10. Therefore, there is a need for an electrostatic discharge apparatus where static electricity is not introduced into the touch sensing unit 20 or the LEDs.

Moreover, static electricity introduced into the ground layer 15 is discharged through the connector unit 30 after passing through all internal circuits of the touch key 10 resulting in repetitive application of static electricity to the internal circuits of the touch key 10 and the connector unit 30. For this reason, touch key circuits included in the connector unit 30 may be damaged. Therefore, there also is a need for an electrostatic discharge apparatus capable of discharging static electricity that is repetitively applied to the connector unit 30. To discharge generated static electricity, the entire surface of the touch key 10 is coated with the EMI paint 14; however, parts included in the touch sensing unit 20 are damaged by the coated EMI paint 14. Therefore, there is a need for an electrostatic discharge apparatus capable of preventing the EMI paint 14 from being coated onto the entire surface of the touch sensing unit 20 and discharging static electricity without passing it through an internal circuit of the touch sensing unit 20.

SUMMARY OF THE INVENTION

To address the above-discussed deficiencies of the prior art, it is a primary object of the present invention to address at least the above problems and/or disadvantages and to provide at least the advantages described below. Accordingly, an aspect of the present invention is to provide an electrostatic discharge apparatus for a touch key, which includes a ground pattern portion formed on a static-electricity introducing path of the touch key to discharge static electricity introduced into the touch key.

Another aspect of the present invention is to provide an electrostatic discharge apparatus for a touch key, in which one end of a ground pattern portion forms at least one pointed and angulated corner in order to efficiently absorb and discharge static electricity generated inside or outside the touch key.

Still another aspect of the present invention is to provide an electrostatic discharge apparatus for a touch key, in which a ground pattern portion having at least one ground patterns is constructed in such a manner as not to be connected with touch key circuits, a conduction-processing portion is constructed only in a connector unit to connect the ground patterns of the ground pattern portion with each other, and a touch sensing unit includes an insulation-processed portion, thereby preventing parts or circuits included in the touch key from being damaged.

According to an aspect of the present invention, there is provided an electrostatic discharge apparatus for a touch key having a touch sensing unit and a connector unit extending from one end of the touch sensing unit. The electrostatic discharge apparatus includes a ground pattern portion having at least one ground patterns, which is included in the touch key and formed on a static-electricity introduction path of the touch key and a conduction-processing portion connecting the ground patterns with each other and connected with a main body.

One end of the ground pattern portion may form at least one angulated corner.

The at least one ground patterns of the ground pattern portion may include a first ground pattern included at one end of an inner side of the touch sensing unit to absorb static electricity introduced through an inner side of the touch key and a second ground pattern included at one end of an outer side of the touch sensing unit and formed between the touch sensing unit and the connector unit to absorb static electricity introduced through an outer side of the touch key.

The first ground pattern and the second ground pattern may be formed adjacent to each other with respect to circuits included in the touch key and may be spaced from the circuits included in the touch key.

The touch sensing unit may include an insulation-processed portion which is insulation-coated to prevent static electricity from being introduced into the touch sensing unit.

The conduction-processing portion may include a conductive paint connecting the first ground pattern with the second ground pattern and included in the connector unit and a conductive member included in the conductive paint and adhered to the conductive paint through a conductive double-sided adhesive member, in which the conductive member is made of a metal plate, one face of which is adhered to the conductive paint through the conductive double-sided adhesive member and the other face of which is adhered to the main body.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

FIGS. 1 through 8, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged electrostatic discharge apparatus.

Figure 1:
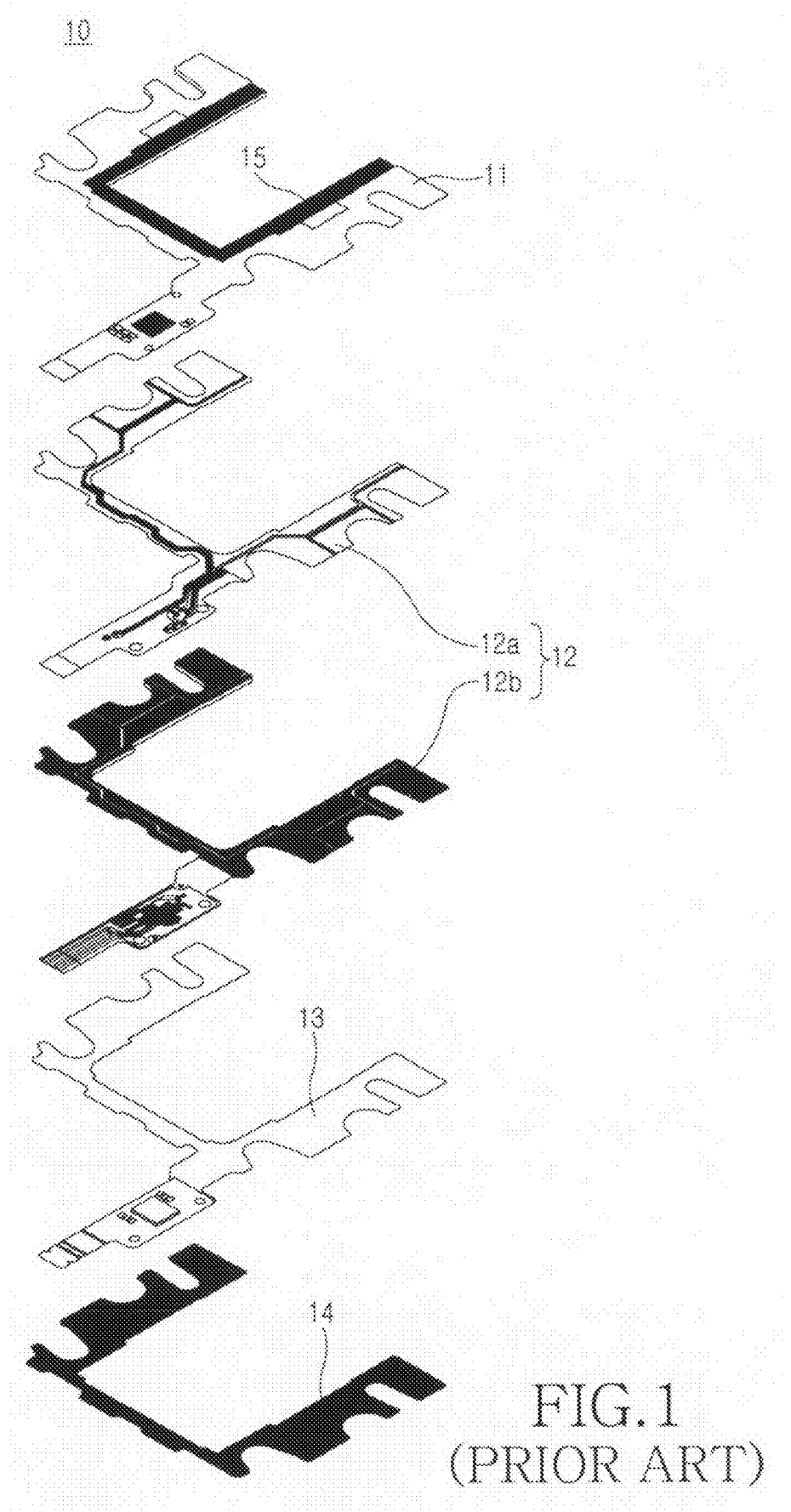
FIG. 1 is an exploded perspective view of a conventional touch key.
Figure 2:
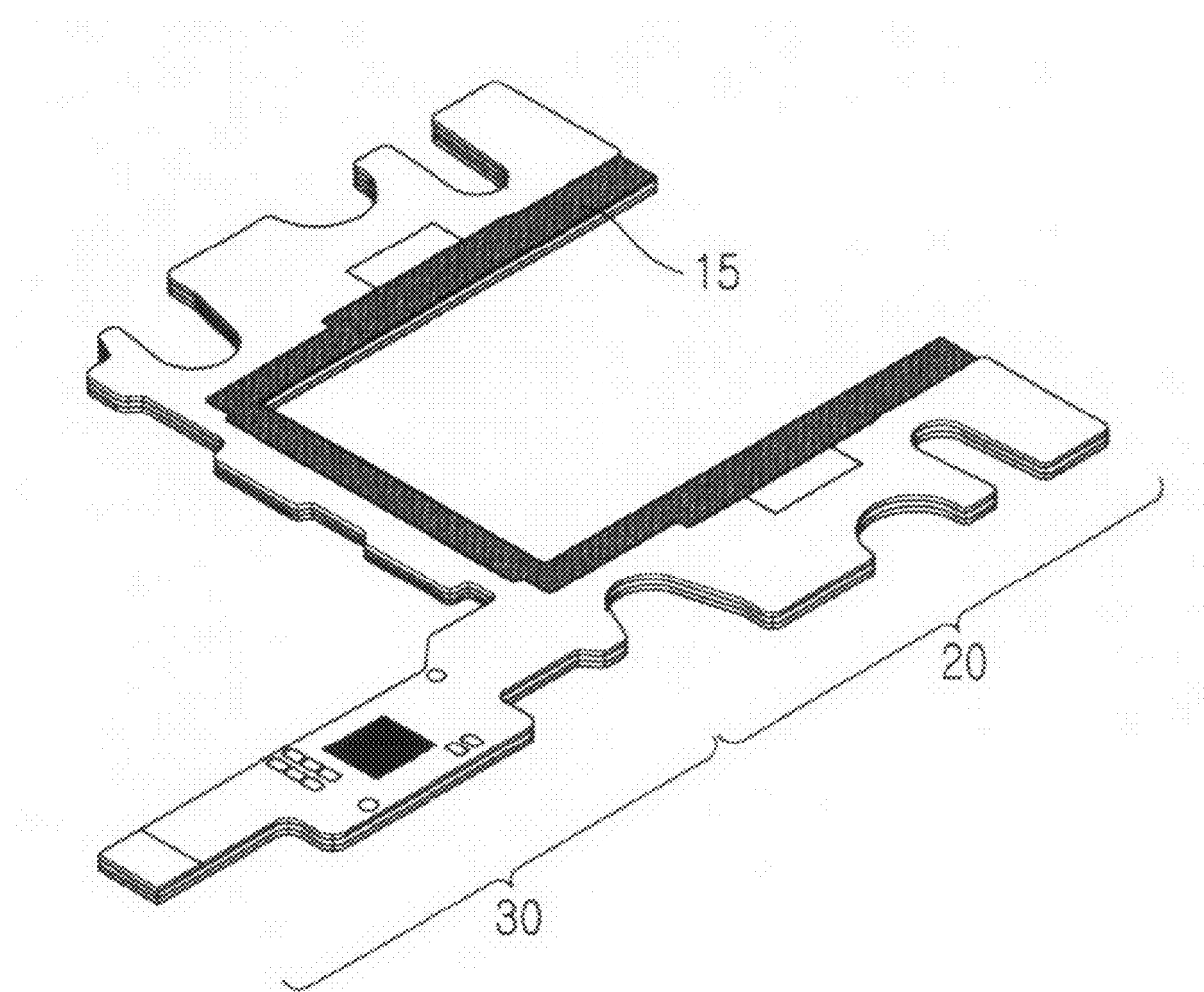
FIG. 2 is a perspective view showing a combined state of the conventional touch key.
Figure 3:
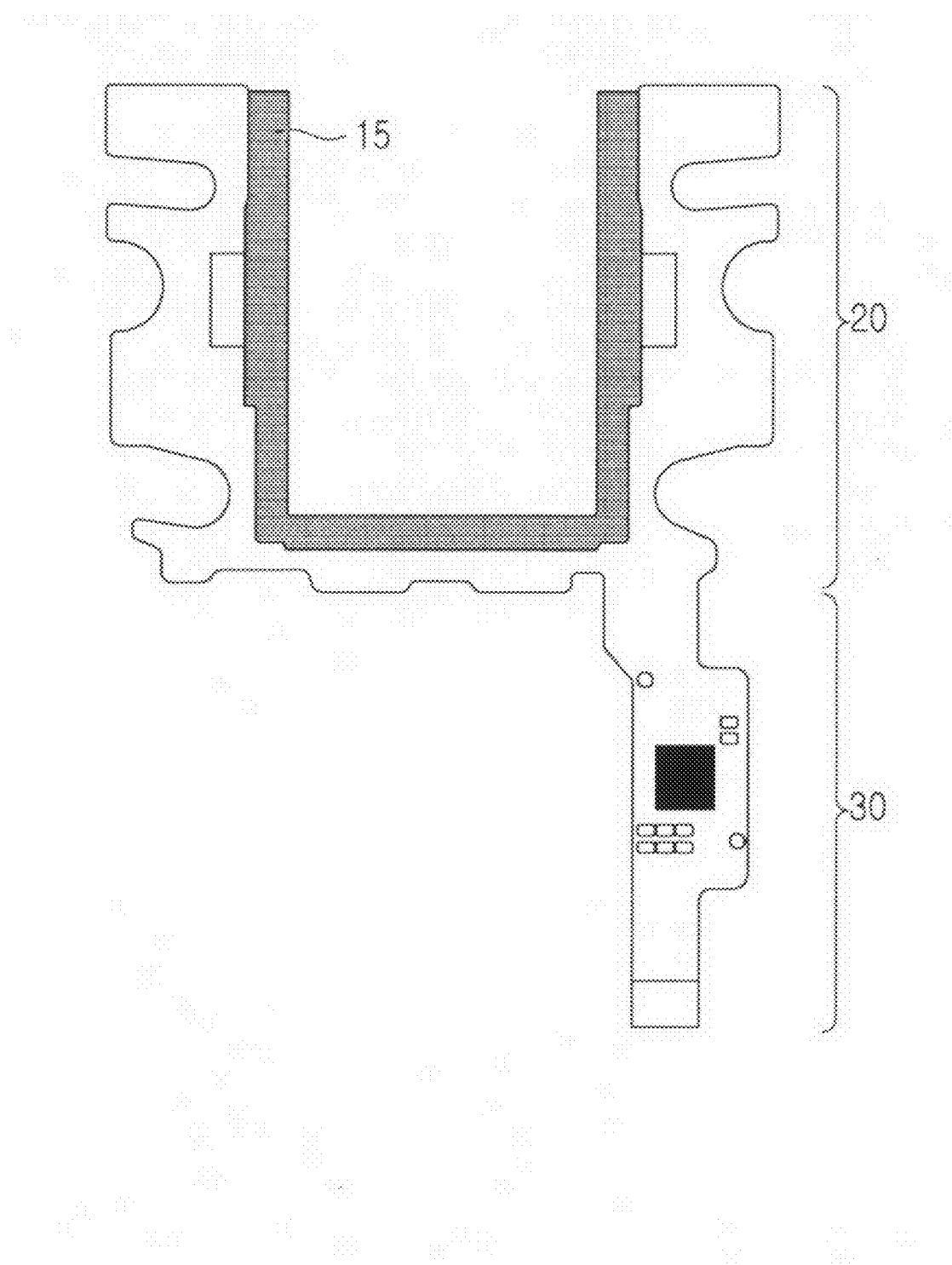
FIG. 3 is a plane view showing the combined state of the conventional touch key.
Figure 4:
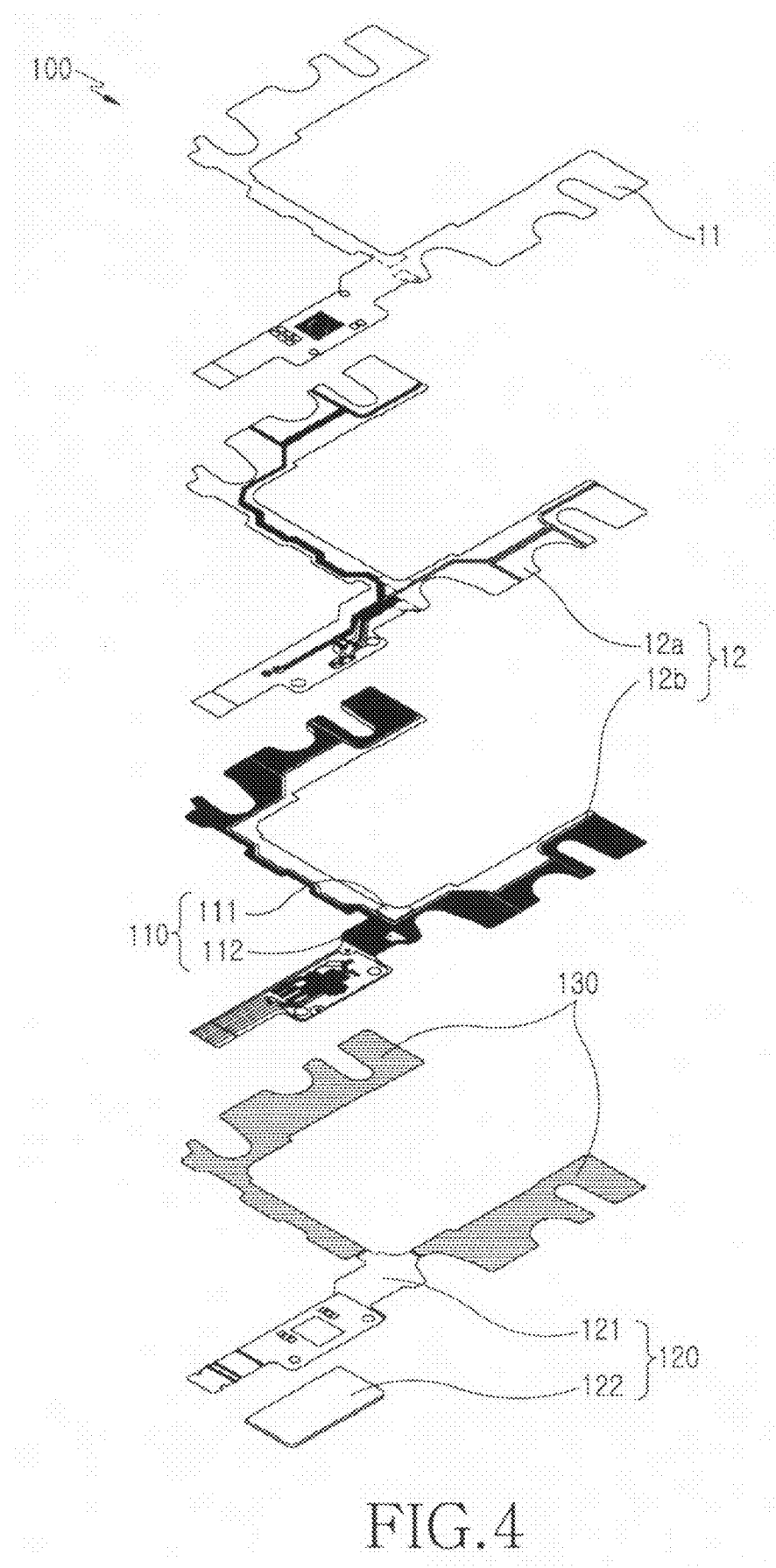
FIG. 4 is a perspective view of an electrostatic discharge apparatus for a touch key according to an exemplary embodiment of the present invention.
Figure 5:
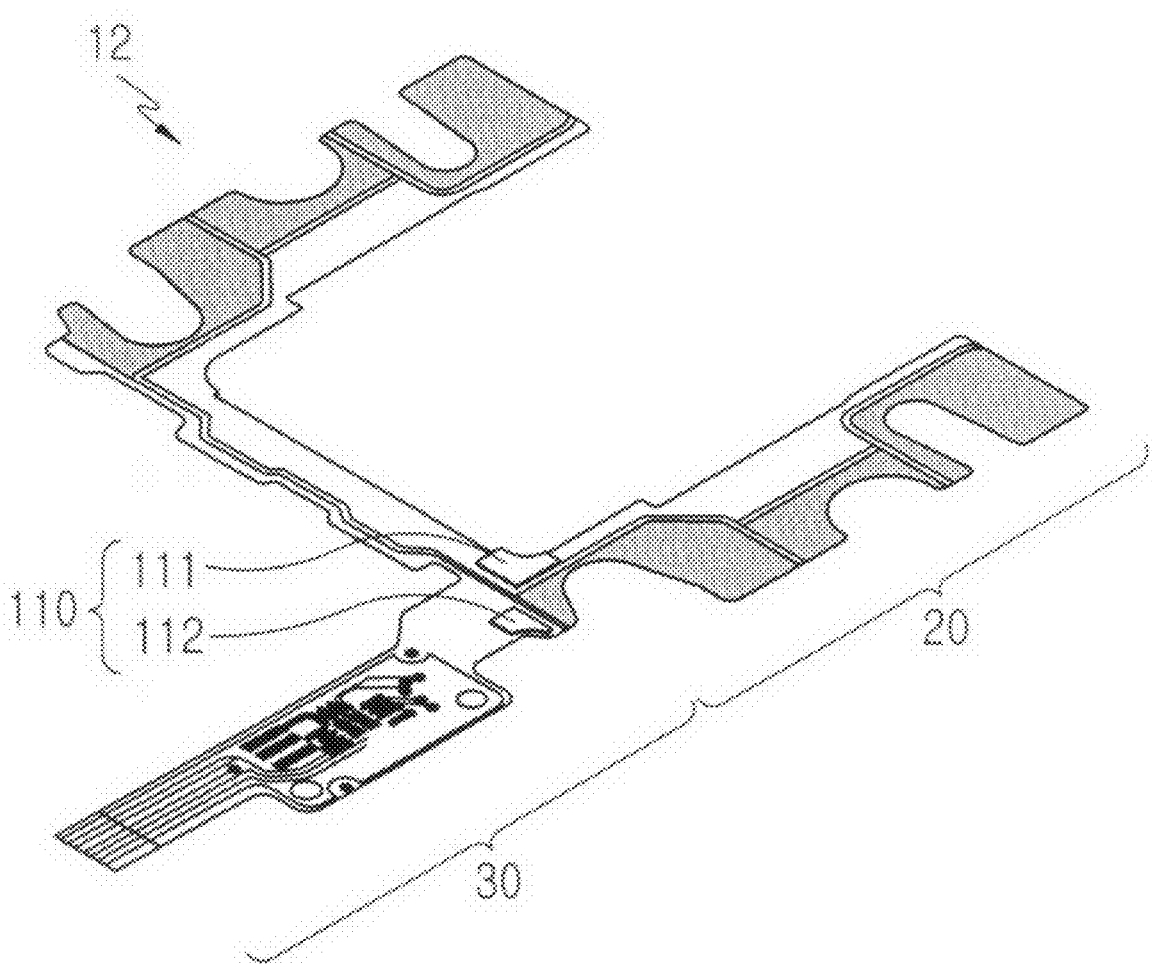
FIG. 5 is a perspective view showing a combined state of a second layer and a third layer which include ground patterns in an electrostatic discharge apparatus for a touch key according to an exemplary embodiment of the present invention.

As shown in FIGS. 4 and 5, an electrostatic discharge apparatus for a touch key 100 according to an exemplary embodiment of the present invention includes a touch sensing unit 20, a connector unit 30 extending from one end of the touch sensing unit 20, a ground pattern portion 110, and a conduction-processing portion 120. The ground pattern portion 110 is included in the touch key 100 to be formed on a static-electricity introducing path of the touch key 100. The conduction-processing portion 120 is included in the connector unit 30 to be attached to a main body in connection with the ground pattern portion 110 for discharge. As shown in FIGS. 4, 5, 7, and 8, one end of the ground pattern portion 110 forms at least one pointed and angulated corner in order to absorb static electricity. As shown in FIGS. 4, 5, 7, and 8, the ground pattern portion 110 has at least one ground patterns including a first ground pattern 111 and a second ground pattern 112. The first ground pattern 111 is included at one end of an inner side of the touch sensing unit 20 in order to absorb static electricity introduced through an inner side of the touch key 100. The second ground pattern 112, formed between the touch sensing unit 20 and the connector unit 30, is included at one end of an outer side of the touch sensing unit 20 in order to absorb static electricity introduced through an outer side of the touch key 100.

Figure 6:
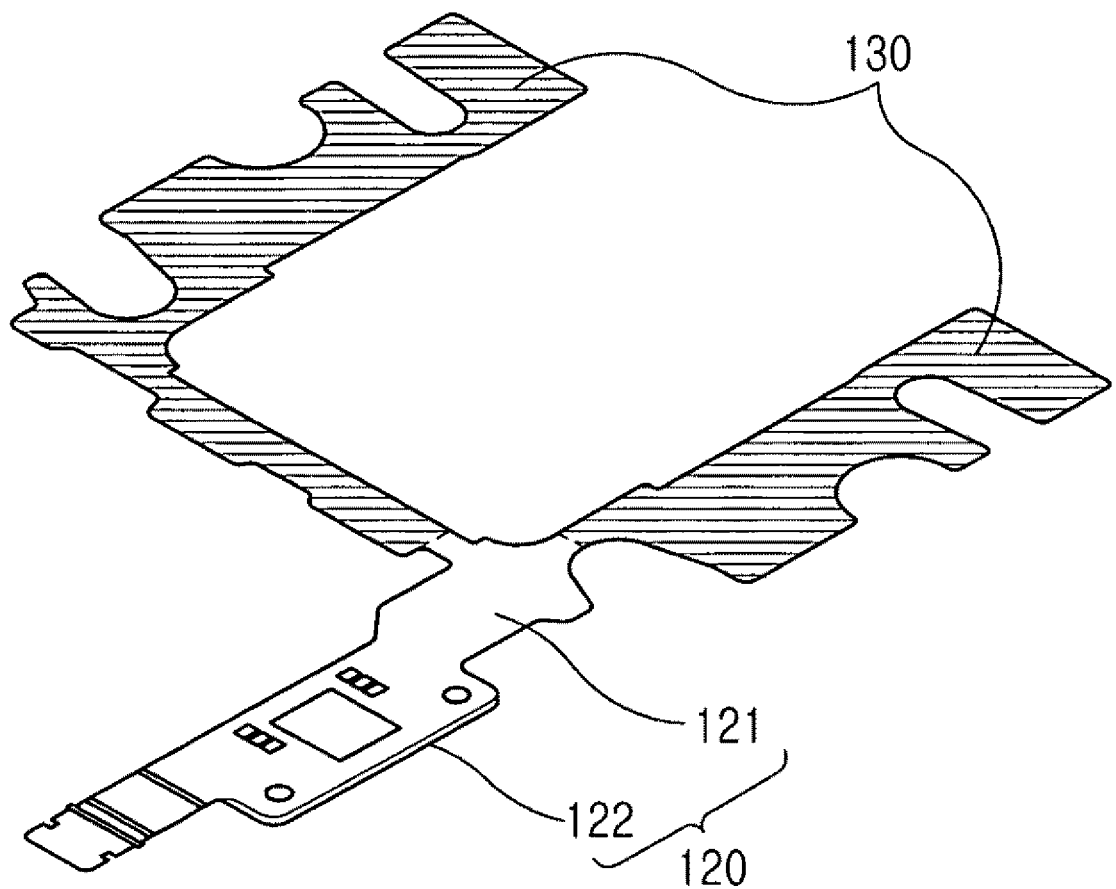
FIG. 6 is a perspective view showing an insulation-processed portion, a conductive paint, and a metal plate mounted on the conductive paint in an electrostatic discharge apparatus for a touch key according to an exemplary embodiment of the present invention.
Figure 7:
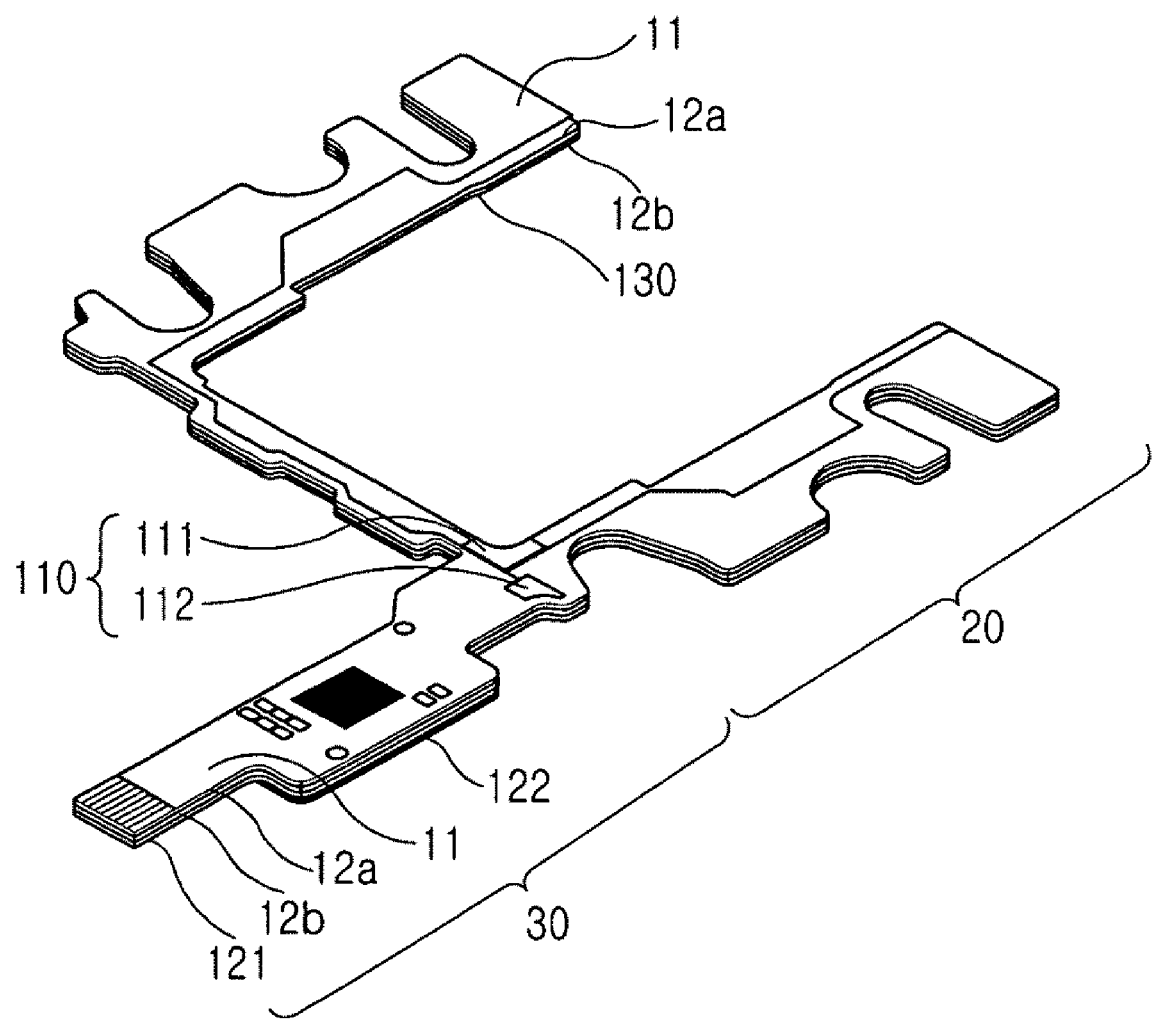
FIG. 7 is a perspective view showing a combined state of an electrostatic discharge apparatus for a touch key according to an exemplary embodiment of the present invention.
Figure 8:
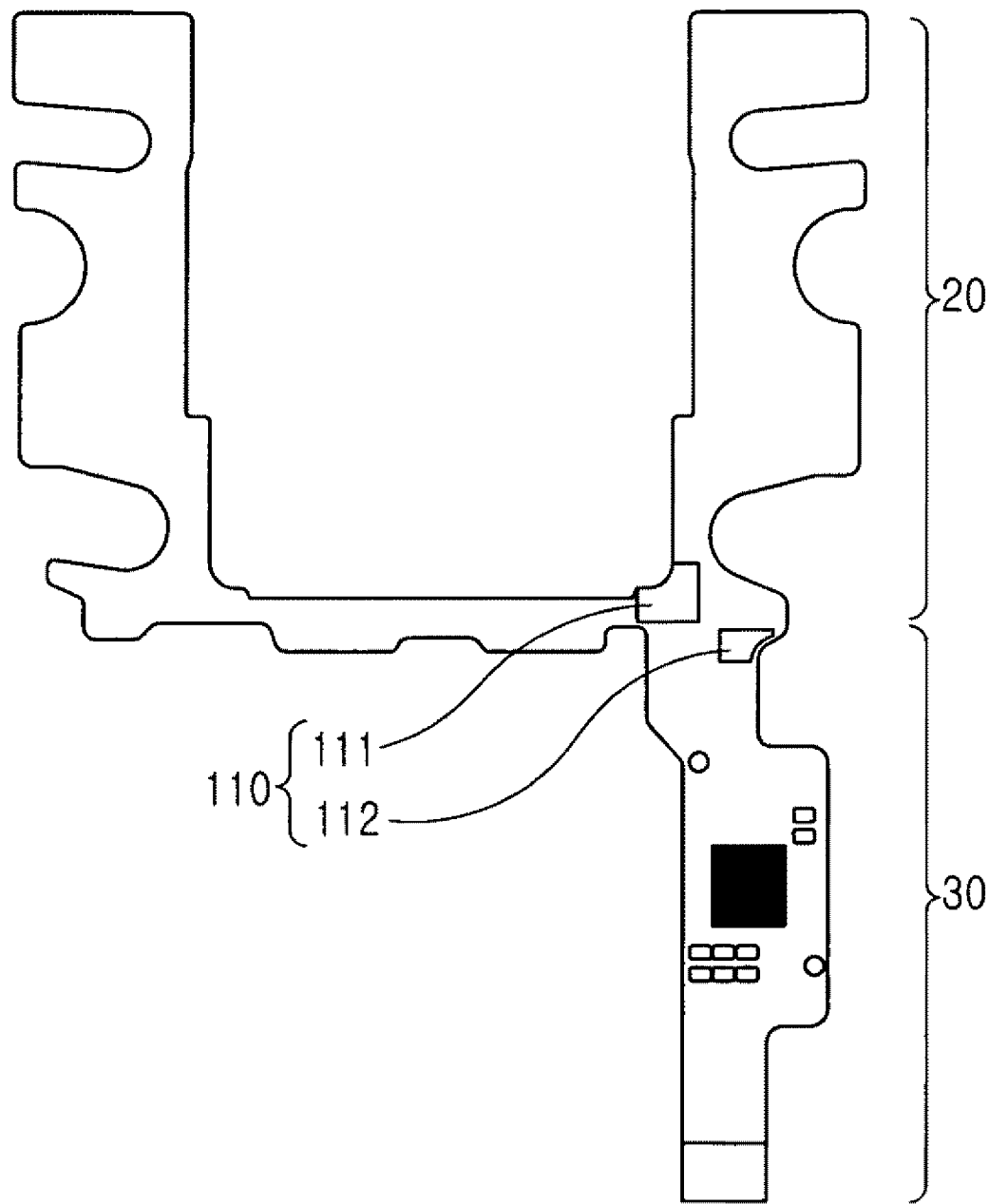
FIG. 8 is a plane view of an electrostatic discharge apparatus for a touch key according to an exemplary embodiment of the present invention.

As shown in FIGS. 4 and 5, the first ground pattern 111 and the second ground pattern 112 are formed adjacent to each other with respect to circuits included in the touch key 100, while being spaced apart from the circuits included in the touch key 100. As shown in FIGS. 4, 6, and 7, the touch sensing unit 20 includes an insulation-processed portion 130. The insulation-processed portion 130 is included in the touch key 100 to be insulation-coated for preventing static electricity from being introduced into the touch sensing unit 20. As shown in FIGS. 4, 6, and 7, the conduction-processing portion 120 includes a conductive paint 121 and a conductive member 122. The conductive paint 121 connects the first ground pattern 111 with the second ground pattern 112 and is coated onto the connector unit 30. The conductive member 122 is made of a metal plate. One face of the conductive member 122 is adhered to the conductive paint 121 through a conductive double-sided adhesive member (not shown), and the other face of which is adhered to the main body to form a discharge path to the main body.

With reference to FIGS. 4 through 8, a detailed description will be made of an operation of the electrostatic discharge apparatus for the touch key 100 according to an exemplary embodiment of the present invention.

The touch key 100 includes the touch sensing unit 20 having a 'U' shape to be provided along the circumference of the Navi key, and the connector unit 30 extending from one end of the touch sensing unit 20 to be mounted on the printed circuit board (not shown) by being introduced into an inner side of the main body of a portable electronic apparatus. The ground pattern portion 110 includes the first ground pattern 111 and the second ground pattern 112. The first ground pattern 111 and the second ground pattern 112 are provided at one ends of layers 11 and 12 forming the touch key 100 while occupying, as small as possible, an area on a path having a possibility of static electricity being introduced thereinto.

The ground pattern portion 110 has a much smaller resistance than the touch sensing unit 20 or light emitting diodes (LEDs). As a result, static electricity generated outside or inside the touch key 100 is introduced into the ground pattern portion 110. To absorb static electricity introduced from an inner side of the touch sensing unit 20, the first ground pattern 111 is provided at one end of the inner side of the touch sensing unit 20 adjacent to the connector unit 30. To absorb static electricity introduced from an outer side of the touch sensing unit 20, the second ground pattern 112 is provided at one end of the outer side of the touch sensing unit 20, wherein the second ground pattern 112 is formed between the touch sensing unit 20 and the connector unit 30 to prevent static electricity introduced from the outer side of the touch sensing unit 20 from being introduced into an integrated circuit (IC) of the touch key 100. Each of one end of the first ground pattern 111 and the second ground pattern 112 forms at least one pointed and angulated corner. Thus, like the principle of a lightning rod, upon generation of static electricity outside or inside the touch key 100, static electricity is efficiently absorbed by the ground pattern portion 110.

The first ground pattern 111 and the second ground pattern 112 are not connected with circuit lines formed in the touch key 100. In addition, a back side of the connector unit 30 is coated with the conductive paint 121 to electrically connect the first ground pattern 111 with the second ground pattern 112. The metal plate 122 is mounted on one face of the conductive paint 121 by using a double-sided adhesive member (not shown) and then is adhered to the main body for grounding. The insulation-processed portion 130 coated with an insulation member is included in the touch sensing unit 20. The conductive paint 121 is not applied to the insulation-processed portion 130. Thus, static electricity generated in the touch key 100 is not introduced into the inner side of the touch key 100.

Since the ground pattern portion 110 has a much smaller resistance than the touch sensing unit 20 or the LEDs and its one end forms at least one pointed corner, static electricity generated inside or outside the touch key 100 is introduced only to the first ground pattern 111 and the second ground pattern 112, and static electricity is prevented from being introduced into a region of the touch key 100 coated with the insulation-processed portion 130. The first ground pattern 111 and the second ground pattern 112 are not connected with circuits of the touch key 100, thereby improving the durability and stability of the touch key 100.

As is apparent from the foregoing description, in the electrostatic discharge apparatus for the touch key according to the present invention, the ground pattern portion having at least one ground patterns is formed in layers forming the touch key to remove a need for a ground layer provided along an inner circumference of a conventional touch sensing unit and to prevent static electricity from being introduced into the touch sensing unit or LEDs, thereby improving the stability of the touch key. Moreover, the ground pattern portion is provided in the inner side of the touch key and between the touch sensing unit and the connector unit, thereby efficiently absorbing static electricity introduced from the inner side or the outer side of the touch key. Furthermore, since the ground pattern portion is not connected with the circuits of the touch key, static electricity is discharged without passing through the internal circuits of the touch key, whereby the introduction of static electricity to the internal circuits of the touch key is prevented, and thus the stability and durability of the touch key are improved. In addition, the conductive paint coats only the connector unit to electrically connect the ground patterns of the ground pattern portion, thereby preventing damage to parts of the touch key and improving the stability and durability of the touch key. Since one end of the ground pattern portion forms at least one pointed and angulated corner, static electricity generated inside or outside the touch key can be absorbed by the ground pattern portion and then discharged. The ground patterns of the ground pattern portion are connected, the conduction-processing portion is included only in the connector unit, and the insulation-processed portion is provided on the entire surface of the touch sensing unit of the touch key, thereby improving the stability of the touch key and reducing cost.

The above-described electrostatic discharge apparatus is not limited to the foregoing embodiment and drawings, and it would be obvious to those of ordinary skill in the art that various substitutions, modifications, and changes may be made without departing from the spirit and scope of the invention. For example, although the first ground pattern and the second ground pattern are provided in the inner side and the outer side of the touch key in the foregoing embodiment of the present invention, the ground pattern portion may be included in a position as close as possible to a main body connecting portion on a path having a possibility of static electricity being introduced thereinto. Moreover, a mounting position of the ground pattern portion may also be changed on the main body. While the shape of the touch sensing unit is 'U' in the drawings and embodiment of the present invention, it may also be changed or substituted according to a mounted shape of the touch key. The electrostatic discharge apparatus according to the present invention can be mounted on any touch key.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. An electrostatic discharge apparatus for a touch key having a touch sensing unit and a connector unit extending from one end of the touch sensing unit, the electrostatic discharge apparatus comprising:
   a ground pattern portion, which is included in the touch key and formed on at least one static-electricity introduction path of the touch key, the ground pattern portion comprising:
      a first ground pattern included at one end of an inner side of the touch sensing unit and configured to absorb static electricity introduced through an inner side of the touch key; and
      a second ground pattern included at one end of an outer side of the touch sensing unit and formed between the touch sensing unit and the connector unit, and configured to absorb static electricity introduced through an outer side of the touch key; and a conduction-processing portion connected with the ground pattern portion and a main body of a portable electronic apparatus associated with the touch key.

2. The electrostatic discharge apparatus of claim 1, wherein one end of the ground pattern portion forms at least one angulated corner.

3. The electrostatic discharge apparatus of claim 1, wherein the first ground pattern and the second ground pattern are formed adjacent to each other with respect to circuits included in the touch key and are spaced from the circuits included in the touch key.

4. The electrostatic discharge apparatus of claim 1, wherein the touch sensing unit comprises an insulation-processed portion which is insulation-coated to prevent static electricity from being introduced into the touch sensing unit.

5. The electrostatic discharge apparatus of claim 1, wherein the conduction-processing portion comprises:
   a conductive paint connecting the first ground pattern with the second ground pattern and included in the connector unit; and
   a conductive member included in the conductive paint and adhered to the conductive paint through a conductive double-sided adhesive member, wherein the conductive member is made of a metal plate, one face of which is adhered to the conductive paint through the conductive double-sided adhesive member and the other face of which is adhered to the main body.

6. The electrostatic discharge apparatus of claim 1, wherein the first ground pattern and the second ground pattern are not connected with circuit lines included in the touch key.

7. The electrostatic discharge apparatus of claim 1, wherein a back side of the connector unit is coated with conductive paint to electrically connect the first ground pattern with the second ground pattern.

8. The electrostatic discharge apparatus of claim 1, the ground pattern portion has a smaller resistance than the touch sensing unit.

9. The electrostatic discharge apparatus of claim 1, wherein one end of each of the first ground pattern and the second ground pattern forms at least one angulated corner.

10. A touch key comprising:
   a touch sensing unit;
   a connector unit extending from one end of the touch sensing unit; and
   an electrostatic discharge apparatus comprising:
      a ground pattern portion formed on at least one static-electricity introduction path of the touch key, the ground pattern portion comprising:
         a first ground pattern included at one end of an inner side of the touch sensing unit and configured to absorb static electricity introduced through an inner side of the touch key; and
         a second ground pattern included at one end of an outer side of the touch sensing unit and formed between the touch sensing unit and the connector unit, and configured to absorb static electricity introduced through an outer side of the touch key, and
      a conduction-processing portion connected with the ground pattern portion and a main body of a portable electronic apparatus associated with the touch key.

11. The touch key of claim 10, wherein one end of the ground pattern portion forms at least one angulated corner.

12. The touch key of claim 10, wherein the first ground pattern and the second ground pattern are formed adjacent to each other with respect to circuits included in the touch key and are spaced from the circuits included in the touch key.

13. The touch key of claim 10, wherein the touch sensing unit comprises an insulation-processed portion which is insulation-coated to prevent static electricity from being introduced into the touch sensing unit.

14. The touch key of claim 10, wherein the conduction-processing portion comprises:
   a conductive paint connecting the first ground pattern with the second ground pattern and included in the connector unit; and
   a conductive member included in the conductive paint and adhered to the conductive paint through a conductive double-sided adhesive member, wherein the conductive member is made of a metal plate, one face of which is adhered to the conductive paint through the conductive double-sided adhesive member and the other face of which is adhered to the main body.

15. The touch key of claim 10, wherein the first ground pattern and the second ground pattern are not connected with circuit lines included in the touch key.

16. The touch key of claim 10, wherein a back side of the connector unit is coated with conductive paint to electrically connect the first ground pattern with the second ground pattern.

17. The touch key of claim 10, the ground pattern portion has a smaller resistance than the touch sensing unit.

18. The touch key of claim 10, wherein one end of each of the first ground pattern and the second ground pattern forms at least one angulated corner.

* * * * *